(12) United States Patent
Dannenberg et al.

(10) Patent No.: US 11,519,803 B2
(45) Date of Patent: Dec. 6, 2022

(54) METHOD FOR MANUFACTURING MICROMECHANICAL DIAPHRAGM SENSORS

(71) Applicant: Robert Bosch GmbH, Stuttgart (DE)

(72) Inventors: Arne Dannenberg, Metzingen (DE); Stephan Oppl, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 396 days.

(21) Appl. No.: 16/626,097

(22) PCT Filed: Jun. 14, 2018

(86) PCT No.: PCT/EP2018/065775
§ 371 (c)(1),
(2) Date: Dec. 23, 2019

(87) PCT Pub. No.: WO2019/001974
PCT Pub. Date: Jan. 3, 2019

(65) Prior Publication Data
US 2020/0209089 A1 Jul. 2, 2020

(30) Foreign Application Priority Data
Jun. 26, 2017 (DE) .......................... 102017210691.3

(51) Int. Cl.
*B81C 1/00* (2006.01)
*G01L 13/02* (2006.01)
*B81B 7/00* (2006.01)

(52) U.S. Cl.
CPC .......... *G01L 13/025* (2013.01); *B81B 7/0048* (2013.01); *B81C 1/00325* (2013.01);
(Continued)

(58) Field of Classification Search
CPC .................................................. B81C 1/00158
See application file for complete search history.

(56) References Cited

U.S. PATENT DOCUMENTS

| 5,427,975 A | * | 6/1995 | Sparks | G01P 15/0802 |
| | | | | 216/2 |
| 2015/0141854 A1 | * | 5/2015 | Eberle | A61B 5/02154 |
| | | | | 600/488 |
| 2016/0327446 A1 | * | 11/2016 | Classen | B81B 7/0048 |

FOREIGN PATENT DOCUMENTS

| DE | 102004043356 A1 | 3/2006 |
| DE | 102008002579 A1 | 12/2009 |

(Continued)

OTHER PUBLICATIONS

International Search Report for PCT/EP2018/065775, dated Sep. 14, 2018.

*Primary Examiner* — Moazzam Hossain
(74) *Attorney, Agent, or Firm* — Norton Rose Fulbright US LLP; Gerard Messina

(57) ABSTRACT

A method for manufacturing a micromechanical sensor, in particular a pressure difference sensor, including creating a functional layer on a substrate; creating at least one rear side trench area proceeding from a rear side of a substrate, for exposing the functional layer for a sensor diaphragm; creating at least one front side trench area for forming at least one supporting structure, in particular an energy storage structure, preferably in the form of a spring structure, in the substrate as a mounting for the sensor diaphragm; and at least partially filling at least a front side trench area with a gel.

11 Claims, 7 Drawing Sheets

(52) U.S. Cl.
CPC ............ *B81B 2201/0264* (2013.01); *B81B 2203/0127* (2013.01); *B81B 2203/0163* (2013.01); *B81B 2203/033* (2013.01); *B81B 2203/0315* (2013.01); *B81B 2203/0338* (2013.01); *B81C 2203/0136* (2013.01)

(56) References Cited

FOREIGN PATENT DOCUMENTS

| | | | |
|---|---|---|---|
| DE | 102010042113 A1 | 4/2012 | |
| DE | 102015120881 A1 | 6/2017 | |
| EP | 0624900 A2 | 11/1994 | |
| JP | H0715019 A | 1/1995 | |
| JP | 2000171318 A | 6/2000 | |
| JP | 2009080095 A | 4/2009 | |
| JP | 2013154465 A | 8/2013 | |
| WO | WO-2015106855 A1 * | 7/2015 | ........... B81B 7/0048 |

\* cited by examiner

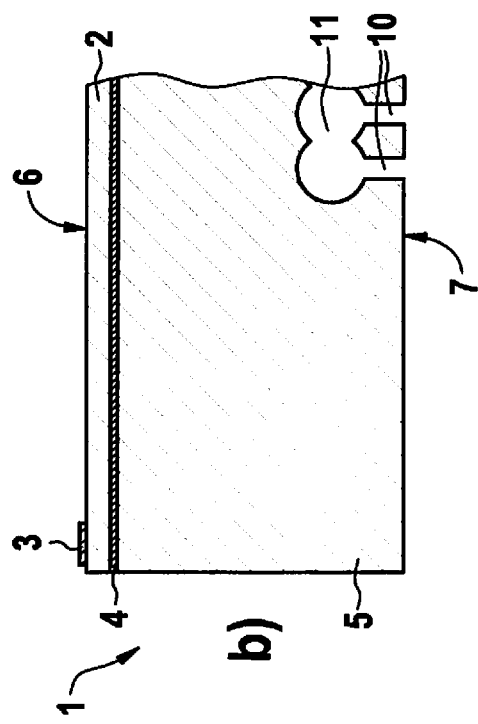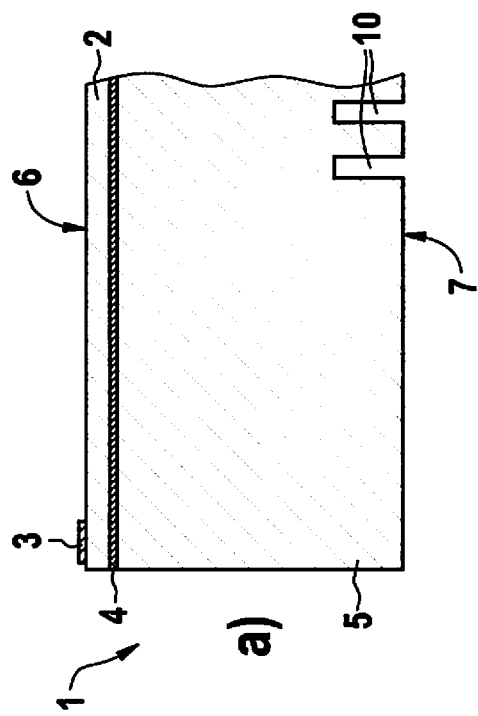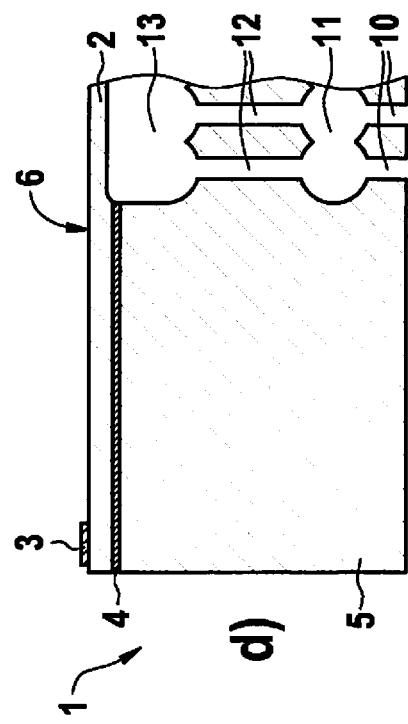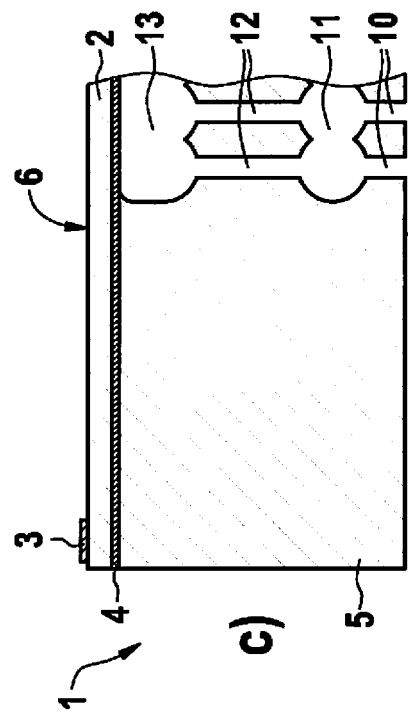
FIG. 1a)-d)

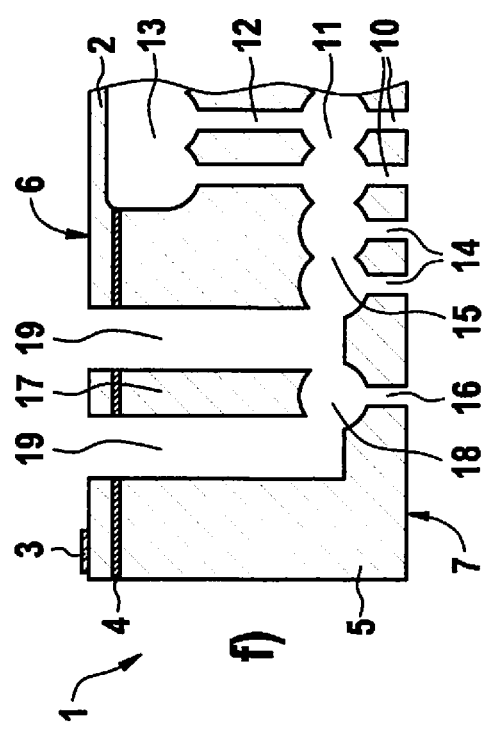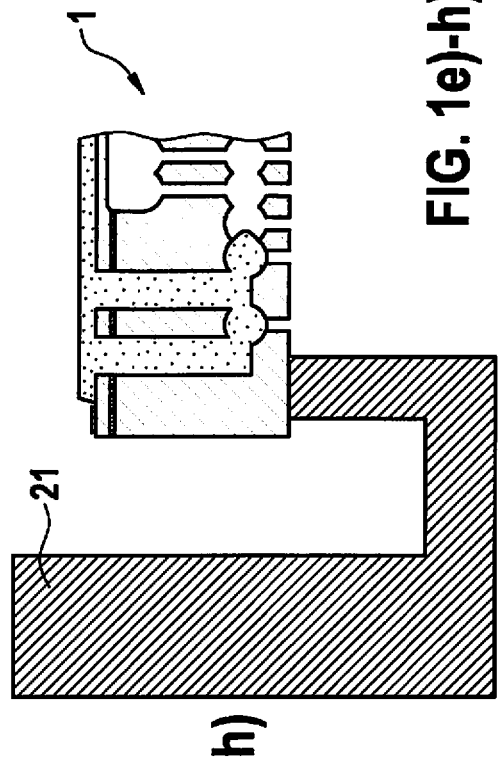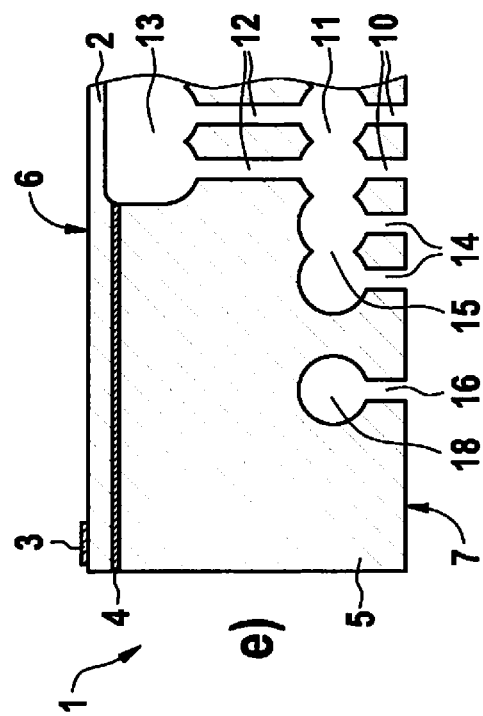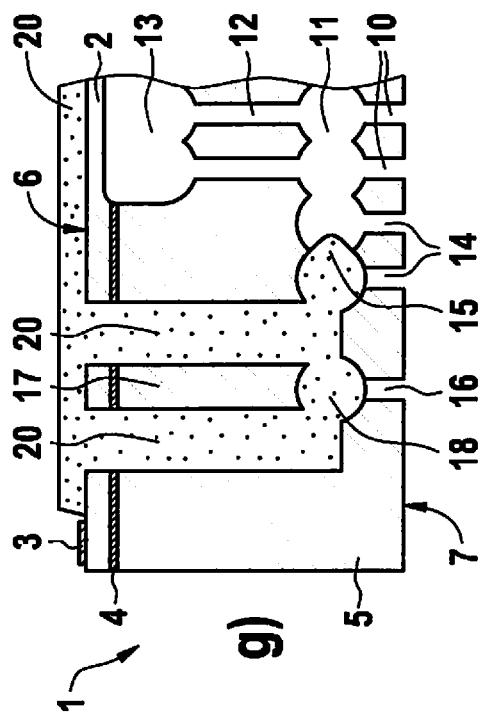
FIG. 1e)-h)

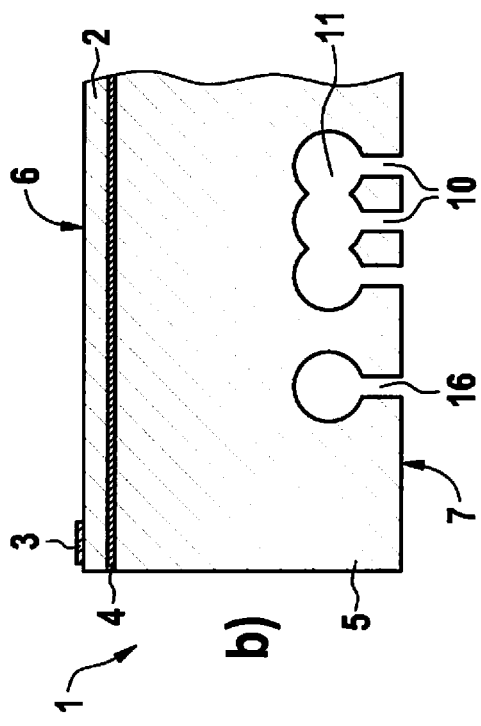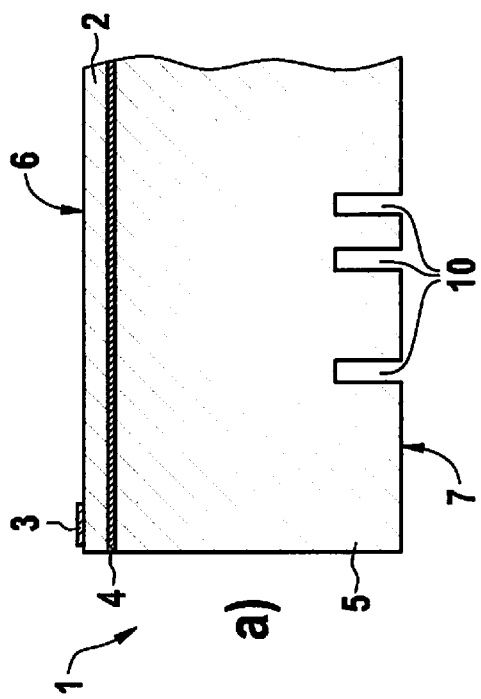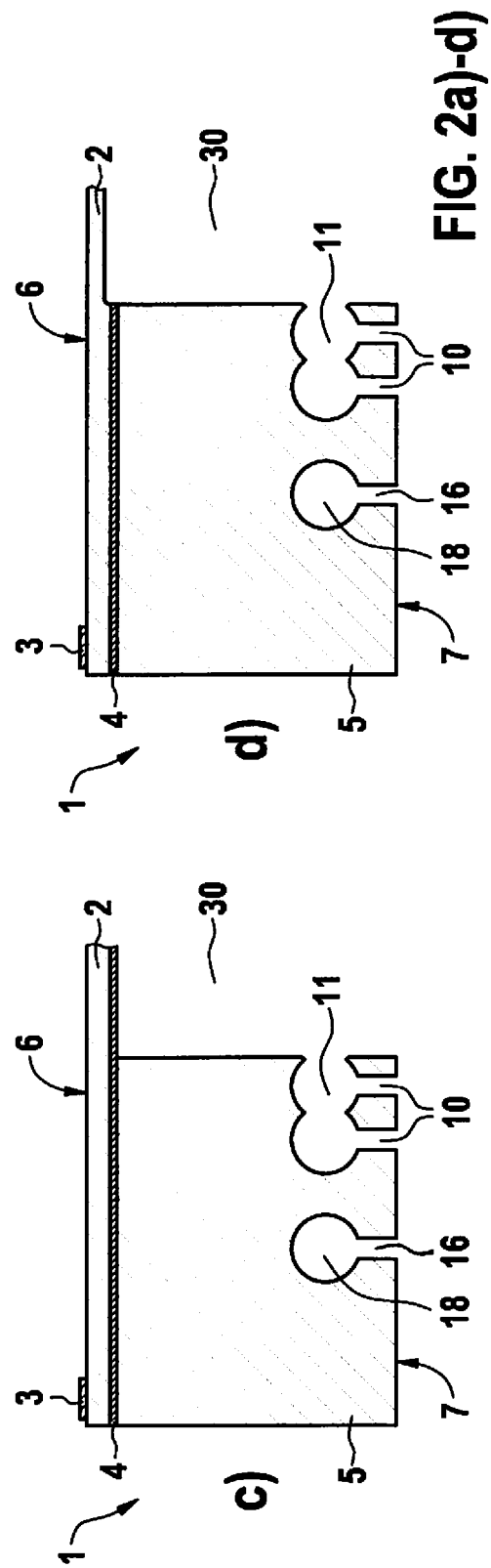
FIG. 2a)-d)

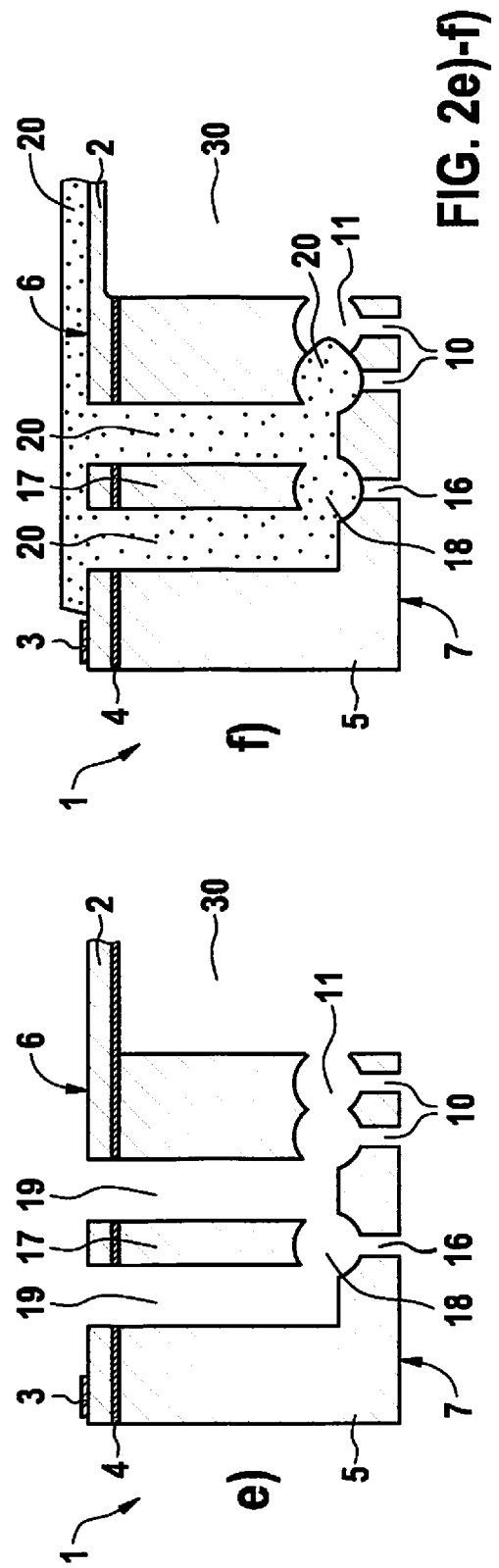

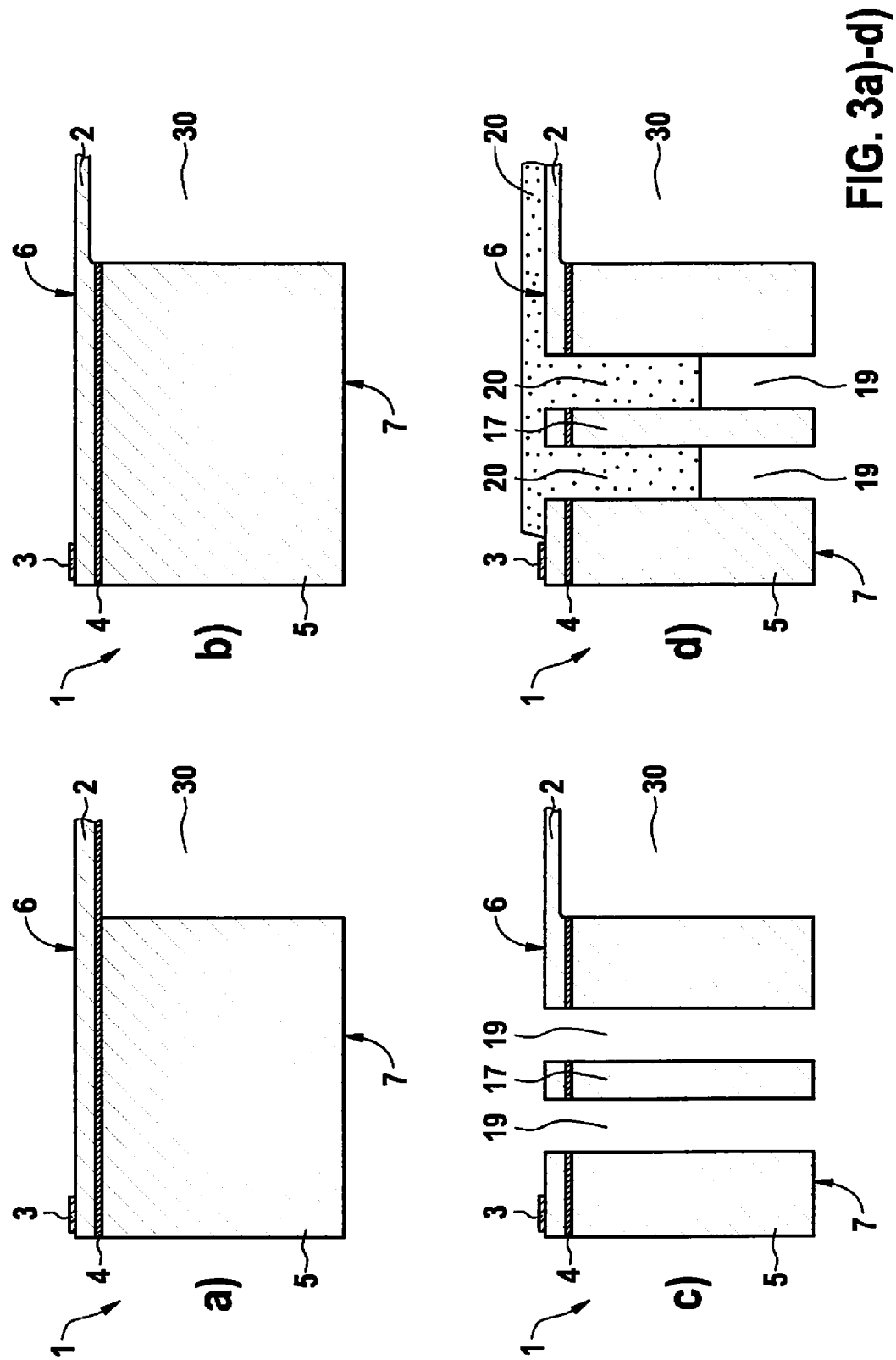
FIG. 3a)-d)

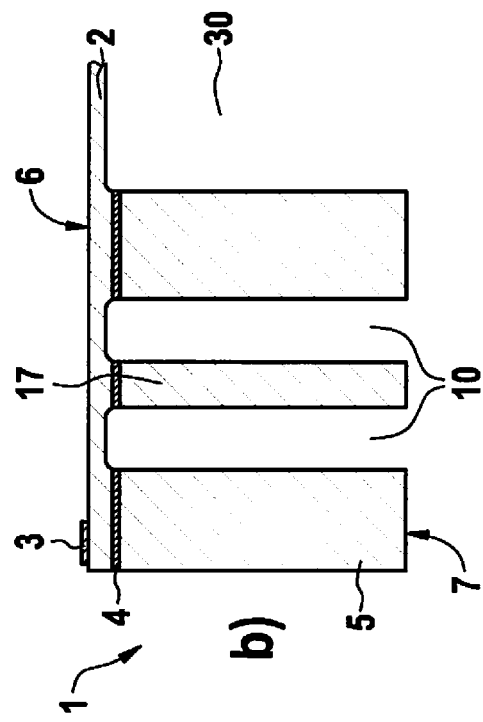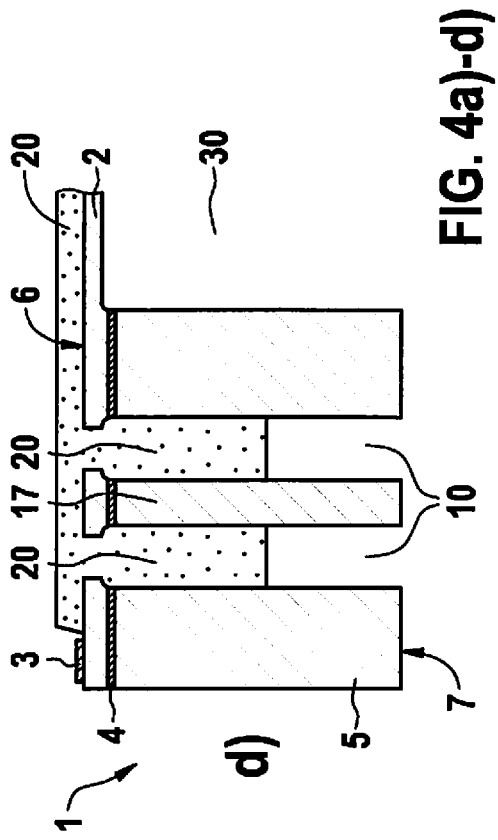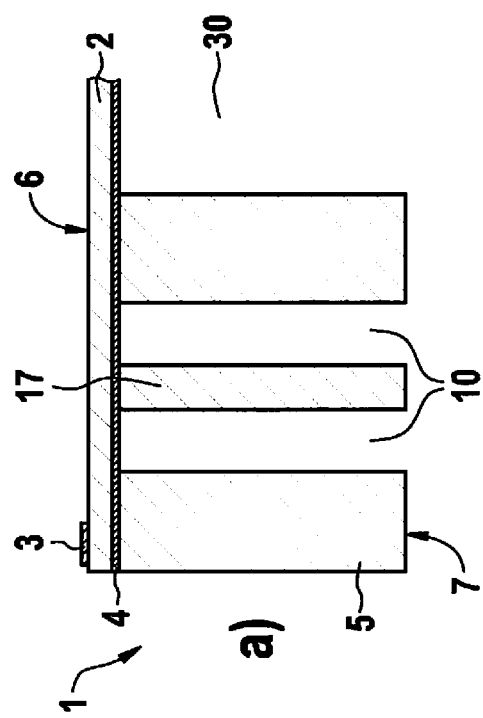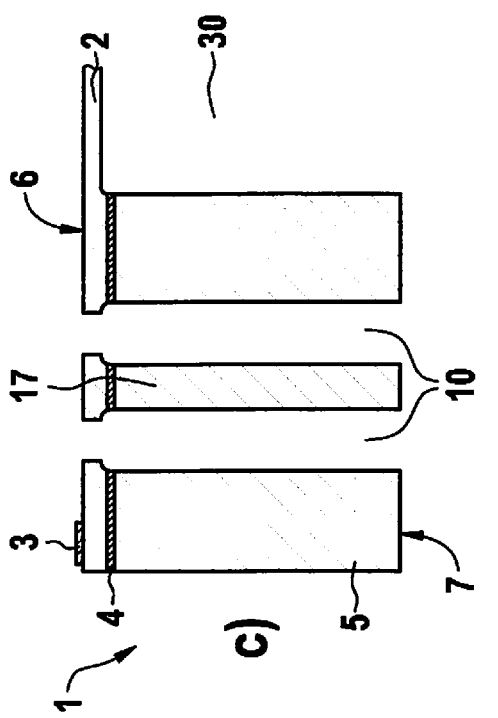
FIG. 4a)-d)

METHOD FOR MANUFACTURING MICROMECHANICAL DIAPHRAGM SENSORS

FIELD

The present invention relates to a method for manufacturing micromechanical sensors, in particular pressure difference sensors.

The present invention also relates to a micromechanical sensor.

Although the present invention may, in general, be applied to any kind of micromechanical sensor, the present invention is described with respect to micromechanical sensors in the form of pressure difference sensors.

BACKGROUND INFORMATION

Micromechanical pressure difference sensors usually include semiconductor resistors, which are used as mechanical-electrical transducers. These detect not only mechanical stresses resulting from the influence of pressure on a corresponding diaphragm, but also stresses from mechanical interfering influences. Mechanical stresses occur, on the one hand, during the connection of the pressure difference sensor, for example due to deformation of a circuit board on which the pressure difference sensor is situated, or also due to contacting with the aid of soldering, during which a deformation of the layer structure/package occurs, and, on the other hand, also due to stresses from the sensor itself. The latter may stem from different temperature behavior of different layers of the layer structure, for example, or also from different temperature behavior of a metallization, in particular when large-surface-area bond lands are applied. The above-described effects are additionally dependent on the manufacturing history of the pressure difference sensor, i.e., the sequence of the manufacturing steps, which may only conditionally be compensated for by an adjustment prior to delivery of the pressure difference sensor.

SUMMARY

Proceeding from this, in accordance with the present invention, it is provided to mechanically decouple parts of the pressure difference sensor, i.e., the diaphragm and the corresponding micromechanical pressure sensors, for example, from the remaining pressure difference sensor, for example by essentially clearing the diaphragm of the pressure sensor on all sides with the aid of trenching, i.e., by essentially clearing the diaphragm on all sides with the aid of etching, with the exception of individual connections to be able to run electrical feed lines via these. The pressure sensor is exposed in the process by a full-surface-area rear side trench, and the rear side trench is subsequently sealed again in a complex process with the aid of a wafer bond with a rear side cap. An additional front side cap having pressure access holes protects the exposed pressure sensor from above.

In one specific embodiment, the present invention provides a method for manufacturing a micromechanical sensor, in particular a pressure difference sensor, including the steps:

creating a functional layer on a substrate;
creating at least one rear side trench area, proceeding from a rear side of a substrate, for exposing the functional layer for a sensor diaphragm;
creating at least one front side trench area for forming at least one supporting structure, in particular an energy storage structure, preferably in the form of a spring structure, in the substrate as a mounting for the sensor diaphragm; and
at least partially filling at least a front side trench area with a gel.

In one further specific embodiment, the present invention provides a micromechanical sensor, manufactured using a method as recited in one of claims 1 through 10, in particular, the micromechanical sensor being designed as a pressure difference sensor, the pressure sensor diaphragm including a functional layer and a gel applied onto the functional layer.

In other words, specific embodiments of the present invention make an exposure of the functional layer on all sides possible, a partial filling with gel of the clearances, trenches and gaps resulting from the partial exposure taking place to seal the front side from the rear side.

One of the achieved advantages is that, in this way, an exposure of a functional layer on all sides, in particular, for forming a pressure sensor diaphragm, is made possible, so that the functional layer area is decoupled from stress from the package or from the application site of the package. Moreover, a filling with gel may take place at the wafer level, and thereby enable more favorable integrated circuit packaging. Another advantage is that a stress decoupling as a result of filling the clearly defined trench areas, for example gaps and the like, in the substrate may take place in a precise manner. This reduces the variance between different sensors since high adhesive thicknesses, which are difficult to control, are no longer necessary.

The term "trenching" shall be understood in the broadest sense and denotes, in particular, the creation of trenches, holes, gaps or the like by removing material from a base material, for example with the aid of etching, in particular reactive ion etching in silicon.

The term "essentially" or "approximately" shall be understood in the broadest sense and refers, in particular, to deviations, variations, tolerances and the like with respect to dimensions, positions, spacings, distances, fractions or the like. For example, the expression "a size is essentially identical to a second size" denotes that the two sizes may deviate from one another, in particular by 100%, preferably by 75%, in particular by 50%, preferably by at least 25%, in particular by 20%, preferably by 10%, in particular at least 0.5%, preferably less than 0.1%, in particular less than 0.001% or the like. For example, the expression "approximately isotropic trenching step" denotes that more than 50%, in particular more than 60%, preferably more than 70%, in particular more than 80%, preferably more than 90%, in particular more than 95% of the trenching takes place isotropically.

The term "gel" shall be understood in the broadest sense and denotes, in particular, a dispersing system which includes at least two components, in particular a polymer network and a solvent. The term "gel" denotes, in particular, a soft mass, and a gel is created when the polymer network has absorbed the entire solvent. In particular, the term "gel" covers both already cross-linked gel and not yet cross-linked gel. Examples of gels are silicone hydrogels, hydrogels based on polyacrylamide or polymacon (CAS number 25053-81-0) or hydrogels based on cross-linked polymers, e.g., poly(2-acrylamido-2-methyl-1-propanesulfonic acid), polyethylene glycol or polyvinylpyrrolidone.

Further features, advantages and further specific embodiments of the present invention are described hereafter or become apparent thereby.

According to one advantageous refinement of the present invention, multiple rear side trench holes for creating the at least one rear side trench area are generated. One of the advantages achieved thereby is that an easy creation of the at least one rear side trench area is made possible.

According to one further advantageous refinement of the present invention, at least one cavity for forming a first connecting trench area between rear side trench holes is generated. In this way, multiple rear side trench holes may be fluidically connected in a simple manner.

According to one further advantageous refinement of the present invention, multiple front side trenches for creating the at least one front side trench area are generated. In this way, on the one hand, an exposure of the functional layer on almost all sides may be achieved in a simple manner and, on the other hand, a suspension for the sensor diaphragm may be created, for example.

According to one further advantageous refinement of the present invention, a stop layer is created between the substrate and the functional layer, and the at least one rear side trench area is created up to the stop layer, and the stop layer is subsequently removed in the area of the sensor diaphragm. With the aid of a stop layer, the process variations may be reduced with a time-controlled manufacturing process.

According to one further advantageous refinement of the present invention, at least one cavity for forming at least one second connecting trench area between multiple front side trench areas is generated. In this way, a fluid connection may be established in a simple manner between two front side trench areas, so that the energy storage structure, for example in the form of a long spring, forms, on which the almost completely exposed sensor diaphragm area is mounted.

According to one further advantageous refinement of the present invention, a diameter of the rear side trench holes is selected to be smaller than the diameter of the cross section of at least one cavity of a first and/or a second connecting trench area(s). In this way, the gel flowing through the rear side of the substrate, for example to a mounting of a wafer, and soiling it, may be easily prevented; the gel may then flow, in particular, only horizontally.

According to one further advantageous refinement of the present invention, multiple first connecting trench areas are created, which are fluidically connected to one another via at least one trench channel, and at least one of the first connecting trench areas being created directly beneath the functional layer for exposing it. In this way, it is possible, on the one hand, to create communicating cavities, and, on the other hand, a soiling of the lower side of the functional layer by particles is even further reduced.

According to one further advantageous refinement of the present invention, the at least one front side trench area is created chronologically before the at least one rear side trench area. One of the advantages achieved thereby is that, initially, front side trench areas are completely created and then, from the rear side, the corresponding rear side trench areas, which overall simplifies the manufacture of a micromechanical sensor.

According to one further advantageous refinement of the present invention, the micromechanical sensor is designed as a pressure difference sensor including a functional layer designed as a pressure sensor diaphragm. In this way, a pressure difference sensor is provided in a simple and cost-effective manner.

Further main features and advantages of the present invention are derived from the figures, and from the associated description of the figures.

It shall be understood that the above-mentioned features and those still to be described hereafter may be used not only in the particular described combination, but also in other combinations, or alone, without departing from the scope of the present invention.

Preferred embodiments and specific embodiments of the present invention are shown in schematic form in the figures and are described in greater detail in the description below, identical reference numerals referring to identical or similar or functionally equivalent components or elements.

BRIEF DESCRIPTION OF THE DRAWINGS

FIGS. 1a through 1h show steps of a method according to a first specific embodiment of the present invention.

FIGS. 2a through 2f show steps of a method according to a second specific embodiment of the present invention.

FIGS. 3a through 3d show steps of a method according to a third specific embodiment of the present invention.

FIGS. 4a through 4d show steps of a method according to a fourth specific embodiment of the present invention.

DETAILED DESCRIPTION OF EXAMPLE EMBODIMENTS

Figure 5:
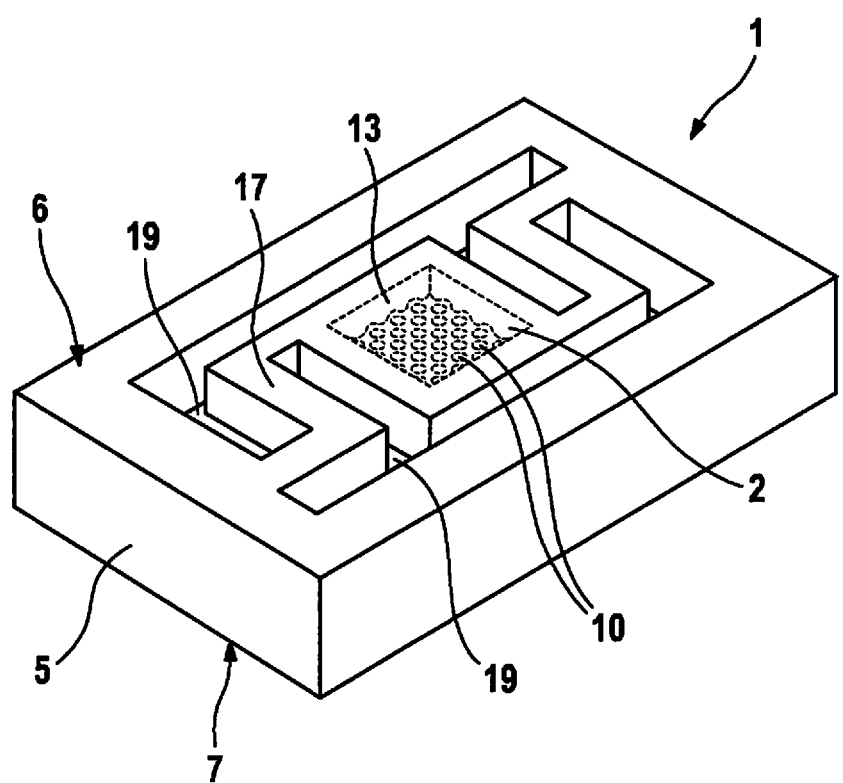
FIG. 5 shows an overview representation of a pressure difference sensor manufactured using a method according to one specific embodiment of the present invention.

FIGS. 1a through 1h show steps of a method according to a first specific embodiment of the present invention for manufacturing a micromechanical sensor 1 including a diaphragm, micromechanical sensor 1 in each case being shown in a cross-sectional view.

In a first step according to FIG. 1a, trench holes 10 having a high aspect ratio, for example between 5 and 100, are created on rear side 7 of a wafer 5, for example with the aid of etching, in wafer 5 including a stop layer 4 introduced in the area of the front side of wafer 5, e.g., a sol wafer, and potentially diffused-in piezoresistive resistors (not shown), strip conductors (not shown) and bond pads 3. Stop layer 4 may be created in the wafer in the known manner, for example with the aid of deposition onto a substrate and the application of a so-called sensor or functional layer 2 onto the deposited stop layer 4. Stop layer 4 may be created from silicon oxide in the known manner in the process.

In a second step according to FIG. 1b, an isotropic or approximately isotropic trenching, using an aspect ratio between 0.1 and 3, is carried out, so that a coherent cavity 11 is created. The two trench holes 10 are fluidically connected by cavity 11.

In a third step according to FIG. 1c, trench holes 10 are extended in the direction of front side 6 or stop layer 4 beyond cavity 11, and a second isotropic or approximately isotropic trenching, using an aspect ratio between 0.1 and 3, is carried out, so that a second cavity 13, which fluidically communicates with or is fluidically connected to first cavity 11, is created beneath stop layer 4.

In a fourth step according to FIG. 1d, stop layer 4 is removed in the area of second cavity 13 to avoid influences of this layer 4 on the mechanical behavior of the exposed functional layer 2 situated above stop layer 4.

In a fifth step according to FIG. 1e, a third isotropic or approximately isotropic trenching is carried out, cavities 15, 16 not communicating with one another or cavities communicating with one another being created for this purpose, the latter not being shown in FIG. 1e. For this purpose, rear side trench holes 10, cavities 11 and 13, and connecting channels 12, created in the second and third steps, may be covered, e.g., with a dry resist, to avoid their being damaged, for example during etching in the fifth step.

In a sixth step according to FIG. 1*f*, a spring structure 17, and thus functional layer 2, in particular the pressure sensor diaphragm area, is also laterally exposed on front side 6 with the aid of trenching 19, on the left side in FIG. 1*f*. Stress decoupling is now ensured, but front and rear sides 6, 7 are still fluidically connected so that it is not possible to measure a differential pressure between the front and rear sides of sensor 1.

In a seventh step according to FIG. 1*g*, the fluidic connection of front side 6 to rear side 7 is interrupted in that a liquid or gel-like material 20 is filled into spaces 19, 18, 15 and applied onto functional layer 2. The pressure sensor diaphragm is thus formed by exposed functional layer 2 and gel 20 applied onto this layer 2. Preferably, gel 20 is initially an essentially liquid material, which becomes gel-like after a curing or cross-linking step, i.e., becomes soft and not plastically deformable. The softer it is designed, the better is the stress decoupling of the pressure sensor diaphragm area from the package. A gel which is not yet cross-linked may, for example, be applied onto the surface of wafer 5 using a screen printing method, without bond pad areas 3 becoming contaminated, for example. At a suitable pressure, gel 20 flows, in particular, into spaces 15, 18, 19, air being able to escape through rear side trench access holes 10, 14, 16. If the diameters of access holes 10, 14, 16 are smaller than the cross section of cavities 11, 15, 18, gel 20 will flow horizontally in the direction of first cavity 11 instead of through rear side 7, i.e., into and through trench holes 10, 14, 16, so that gel 20 could, e.g., soil the mounting for wafer 5. At a suitable horizontal flow path length from the lower area of front side trench 18 to first cavity 11, reliable process control of the gel filling step is provided. It is even possible for a portion of first cavity 11 to be filled with gel 20, without significantly influencing the sensor performance. However, a filling of first cavity 11 should be avoided since in this way second cavity 13 becomes closed, and it is no longer possible to apply pressure to the rear side of diaphragm 2.

In an eighth step according to FIG. 1*h*, micromechanical sensor 1 is bonded during integrated circuit packaging in such a way that the front side and rear side pressure may be connected.

FIGS. 2*a* through 2*f* show steps of a method according to a second specific embodiment of the present invention.

FIGS. 2*a* through 2*f* show a second specific embodiment of the present invention for manufacturing a difference pressure sensor including only one isotropic or approximately isotropic trench having an aspect ratio between 0.1 and 3 and having no lattice structure beneath the pressure sensor diaphragm.

In a first step according to FIG. 2*a*, multiple rear side trench holes 10, 16 having a high aspect ratio, for example between 5 and 100, are created, as in step 1 of FIG. 1*a*.

In a second step according to FIG. 2*b*, cavities 11, 18 are then generated with the aid of these from rear side 7 of wafer 5 with the aid of an isotropic or approximately isotropic trench, one of the cavities 11 fluidically connecting multiple trench holes 10.

In a third step according to FIG. 2*c*, a cavity 30 is generated up to stop layer 4, e.g., silicon oxide of an SOI wafer, for example with the aid of anisotropic etching, so that pressure sensor diaphragm 2 is defined, i.e., essentially exposed therebeneath. In the process, the access holes or rear side trench holes 10 to cavity 11 may be masked, for example, with the aid of dry resist. Cavity 30 to stop layer 4 overlaps with cavity 11, so that subsequently an exposed pressure sensor diaphragm area is created.

In a fourth step according to FIG. 2*d*, stop layer 4 beneath functional layer 2 is removed to avoid influences of stop layer 4 on the mechanical behavior of the later pressure sensor diaphragm.

In a fifth step according to FIG. 2*e*, the pressure sensor diaphragm area is exposed with the aid of front side trenches 19 in such a way that cavity 18 fluidically connects front side trenches 19, and also a fluidic connection is established between cavities 11, 18.

In a sixth step according to FIG. 2*f*, the spaces, similarly to the eighth step according to FIG. 1*h*, are filled with gel 20, or gel 20 is applied onto functional layer 2, which is subsequently cured or cross-linked. The pressure sensor diaphragm is thus again formed by exposed functional layer 2 and gel 20 applied onto this functional layer 2.

FIGS. 3*a* through 3*d* show steps of a method according to a third specific embodiment of the present invention.

FIGS. 3*a* through 3*d* show a process sequence for manufacturing a difference pressure sensor without an isotropic or approximately isotropic trenching step, without a lattice structure beneath the pressure sensor diaphragm, and without a collection area for gel 20.

The first step according to FIG. 3*a* essentially corresponds to the first step according to FIG. 1*a*. In contrast to the first step according to FIG. 1*a*, no rear side trench holes 10 are generated in the first step according to FIG. 3*a*, however trenching is carried out up to stop layer 4, and a pressure sensor diaphragm is thus defined.

In a second step according to FIG. 3*b*, stop layer 4 is removed.

In a third step according to FIG. 3*c*, trenching is carried out from front side 6 through the entire wafer 5, resulting in gaps 19, stop layer 4 being removed in between.

In a fourth step according to FIG. 3*d*, these are again filled with gel 20, and gel 20 is applied onto the upper side of functional layer 2, essentially similar to the seventh step according to FIG. 1*g*. Pressure sensor diaphragm 2, 20 is thus again formed by the exposed area of functional layer 2 and gel 20 applied onto this layer 2.

FIGS. 4*a* through 4*d* show steps of a method according to a fourth specific embodiment of the present invention.

FIGS. 4*a* through 4*d* shows a process sequence for manufacturing a pressure difference sensor according to a fourth embodiment variant of the present invention without an isotropic or approximately isotropic trenching step, without a lattice structure beneath the pressure sensor diaphragm, and without a gel collection area.

In a first step according to FIG. 4*a*, trenches 10 and a trench 30 for exposing the pressure sensor diaphragm area are implemented up to stop layer 4 on the rear side.

In a second step according to FIG. 4*b*, the respective stop layer 4 is removed in the two rear side trenches 10 and trench 30.

In a third step according to FIG. 4*c*, the two rear side trenches 10 are now accordingly opened from the front, stop layer 4 no longer needing removal.

In a fourth step according to FIG. 4*d*, a filling of trenches 10 now takes place in such a way that gel 20 only partially flows into rear side trenches 10. In other words, in the specific embodiment of FIG. 4, a portion of the decoupling interspaces for exposing spring structure 17 is created during the step of defining the pressure sensor diaphragm with the aid of trench 30. This has the advantage, among other things, that the etching time is shortened, since encompassing etching from front side 6 to rear side 7 of functional layer 2 is reduced due to the larger diffusion path and the lower variance of the etching time after local opening of front side 6 to rear side 7.

FIG. 5 shows an overview representation of a pressure difference sensor manufactured using a method according to one specific embodiment of the present invention.

FIG. 5 shows a pressure difference sensor after carrying out steps a) through f) according to FIG. 1. FIG. 5 shows a cross section from the left side of substrate 5 to the center of the pressure sensor diaphragm. Functional layer 2 is only implied, and the gel filling is not shown. Rear side trench holes 14 and the area or cavity 13 exposed beneath functional layer 2 are apparent. Rear side trench holes 16 beneath the exposed spring-like structure 17 are not shown in FIG. 5. Spring-like structure 17 is formed in an essentially S-shaped manner here, proceeding from two of the four edges of substrate 5.

In all specific embodiments, the structures shown as bar springs 17 may also be designed or separated as meander-shaped springs, springs having angles, or springs having arbitrary curve shapes. An arbitrary number of springs may be designed for contacting the area of the pressure sensor diaphragm. The springs may be combined with one another and/or split up in the process and are used for mounting and, if necessary, contacting sensors in the area of the pressure sensor diaphragm.

In summary, at least one specific embodiment has at least one of the following advantages or enables one of these advantages:
avoiding stress from the package
avoiding stress from the storage site of the package
more favorable integrated circuit packaging
gel filling possible at wafer level, for example with the aid of screen printing
controlled filling due to the clearly defined trenches/trench holes.

Although the present invention has been described based on preferred exemplary embodiments, it is not limited thereto, but is modifiable in a variety of ways.

What is claimed is:

1. A method for manufacturing a micromechanical sensor, comprising the following steps:
creating a functional layer on a substrate;
creating at least one rear side trench area, proceeding from a rear side of a substrate to expose the functional layer for a sensor diaphragm;
creating at least one front side trench area to form at least one supporting structure, the supporting structure being an energy storage structure, in the substrate as a mounting for the sensor diaphragm; and
at least partially filling at least one of the at least one front side trench area with a gel,
wherein the energy storage structure is a spring structure, and wherein the spring structure is laterally exposed in the at least one front side trench area.

2. The method as recited in claim 1, wherein the micromechanical sensor is a pressure difference sensor.

3. The method as recited in claim 1, wherein multiple rear side trench holes for creating the at least one rear side trench area are generated.

4. The method as recited in claim 3, wherein at least one cavity for forming a first connecting trench area between rear side trench holes is generated.

5. The method as recited in claim 4, wherein multiple front side trenches for creating the at least one front side trench area are generated.

6. The method as recited in claim 1, wherein:
a stop layer is created between the substrate and the functional layer,
the at least one rear side trench area is created up to the stop layer, and
the stop layer is subsequently removed in an area of the sensor diaphragm.

7. The method as recited in claim 5, wherein at least one cavity for forming at least one second connecting trench area between multiple ones of the multiple front side trench areas is generated.

8. The method as recited in claim 7, wherein a diameter of the rear side trench holes is selected to be smaller than a diameter of a cross section of at least one cavity of the first connecting area and/or the second connecting trench area.

9. The method as recited in claim 4, wherein multiple first connecting trench areas are created, which are fluidically connected to one another via at least one trench channel, at least one of the first connecting trench areas being created directly beneath the functional layer for exposing it.

10. The method as recited in claim 1, wherein the at least one front side trench area is created chronologically before the at least one rear side trench area.

11. The method as recited in claim 7, wherein one or multiple access channels to the first connecting trench area and/or second connecting trench area is masked during the exposure of the functional layer.

\* \* \* \* \*